(12) United States Patent
Kim

(10) Patent No.: US 9,548,471 B2
(45) Date of Patent: Jan. 17, 2017

(54) ORGANIC LIGHT EMITTING DEVICE AND METHOD OF MANUFACTURING THE SAME

(71) Applicant: LG Display Co., Ltd., Seoul (KR)

(72) Inventor: Chang Nam Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/800,186

(22) Filed: Jul. 15, 2015

(65) Prior Publication Data

US 2015/0318514 A1    Nov. 5, 2015

Related U.S. Application Data

(62) Division of application No. 13/925,414, filed on Jun. 24, 2013, now Pat. No. 9,118,036.

(30) Foreign Application Priority Data

Oct. 31, 2012    (KR) .................. 10-2012-0122329

(51) Int. Cl.
H01L 29/08    (2006.01)
H01L 21/00    (2006.01)
(Continued)

(52) U.S. Cl.
CPC ......... H01L 51/5246 (2013.01); G06F 1/1652 (2013.01); G06F 3/044 (2013.01);
(Continued)

(58) Field of Classification Search
CPC .................................................... H01L 25/048
(Continued)

(56) References Cited

U.S. PATENT DOCUMENTS

2008/0211395 A1    9/2008 Koshihara
2010/0231840 A1    9/2010 Saida et al.
(Continued)

FOREIGN PATENT DOCUMENTS

CN    1497419 A    5/2004
CN    102665308 A    9/2012
DE    102011056000    6/2012

OTHER PUBLICATIONS

Office Action for German Patent Application No. DE 10 2013 111 909.3, Nov. 11, 2016, 8 pages (With Concise Explanation of Relevance).

*Primary Examiner* — Julio J Maldonado
*Assistant Examiner* — Moin Rahman
(74) *Attorney, Agent, or Firm* — Fenwick & West LLP

(57) ABSTRACT

Disclosed is an organic light emitting device and a method of manufacturing the same, wherein the organic light emitting device is decreased in its thickness, and also decreased in its radius of curvature so as to realize the flexible device, and the organic light emitting device comprising a first component including a first plurality of layers, the first plurality of layers including a thin film transistor layer deposited on a surface of a first substrate, an emitting component layer deposited on the thin film transistor layer, and a passivation layer deposited on the emitting component layer; a second component including a second plurality of layers that are deposited on a surface of a second substrate without using an adhesive; and an adhesion layer between the first component and the second component, the adhesion layer coupling together the first component and the second component.

10 Claims, 6 Drawing Sheets

(51) Int. Cl.

| | | |
|---|---|---|
| *H01L 51/52* | (2006.01) | |
| *H01L 51/56* | (2006.01) | |
| *H01L 27/32* | (2006.01) | |
| *G06F 1/16* | (2006.01) | |
| *G06F 3/041* | (2006.01) | |
| *G06F 3/044* | (2006.01) | |

(52) U.S. Cl.
CPC .......... *G06F 3/0412* (2013.01); *H01L 27/322* (2013.01); *H01L 27/323* (2013.01); *H01L 27/3246* (2013.01); *H01L 27/3251* (2013.01); *H01L 27/3272* (2013.01); *H01L 51/5281* (2013.01); *H01L 51/56* (2013.01); *G06F 2203/04102* (2013.01); *G06F 2203/04103* (2013.01); *H01L 2227/323* (2013.01); *H01L 2227/326* (2013.01); *H01L 2251/5338* (2013.01); *H01L 2251/558* (2013.01)

(58) Field of Classification Search
USPC ..... 257/13, 79–103, 918, 40, 642–643, 759; 438/22–47, 69, 493, 503, 507, 956
See application file for complete search history.

(56) References Cited

U.S. PATENT DOCUMENTS

| | | |
|---|---|---|
| 2011/0163339 A1 | 7/2011 | Negishi et al. |
| 2011/0223697 A1 | 9/2011 | Yong-Hwan et al. |
| 2012/0105347 A1* | 5/2012 | Pak .................. G06F 3/0412 345/173 |
| 2012/0139821 A1 | 6/2012 | Kim et al. |
| 2013/0089940 A1 | 4/2013 | Arai et al. |
| 2014/0285738 A1 | 9/2014 | Iwase |

\* cited by examiner

ORGANIC LIGHT EMITTING DEVICE AND METHOD OF MANUFACTURING THE SAME

CROSS REFERENCE TO RELATED APPLICATIONS

This application is a divisional of U.S. patent application Ser. No. 13/925,414 filed on Jun. 24, 2013 which claims the benefit of Korean Patent Application No. 10-2012-0122329 filed on Oct. 31, 2012, each of which is hereby incorporated by reference as if fully set forth herein.

BACKGROUND

Field of the Disclosure

The embodiments herein relate to an organic light emitting device, and more particularly, to an organic light emitting device with a touch sensor.

Discussion of the Related Art

Among various flat display devices, a liquid crystal display (LCD) device has been widely used up to now. However, the LCD device inevitably requires a backlight unit, and also shows limitation in brightness and contrast ratio. In contrast to the LCD device, an organic light emitting device can emit light in itself, that is, the organic light emitting device needs no additional backlight unit, and obtains relatively better brightness and contrast ratio. Thus, there is an increasing interest for the organic light emitting device.

The organic light emitting device may include a cathode for injecting an electron, an anode for injecting a hole, and a light emitting layer provided between the cathode and the anode. In this case, the electron generated in the cathode and the hole generated in the anode are injected into the inside of the light emitting layer, and the injected electron and hole combine to generate an exciton. When the generated exciton falls from an excited state to a ground state, a light emitting state occurs, whereby an image is displayed on the organic light emitting device.

Generally, the organic light emitting device uses an input means such as mouse or key board. However, when the organic light emitting device is applied to products such as navigation, mobile phone or PDA, a touch sensor is widely used, which allows a user to input information by directly touching a screen with a finger, a pen or the like.

Hereinafter, a related art organic light emitting device with a touch sensor will be described with reference to the accompanying drawings.

FIG. 1 is a cross sectional view illustrating a related art organic light emitting device.

As shown in FIG. 1, the related art organic light emitting device may include a lower substrate 10, a component layer 20, a barrier layer 30, a polarizing film 40, a touch sensor 50, an upper substrate 60, and an adhesive layer 70.

The lower substrate 10 is generally formed of glass. However, in order to realize a flexible organic light emitting device, which is capable of being bent or curved, the lower substrate 10 may be formed of transparent plastic material.

The component layer 20 is formed on the lower substrate 10, wherein the component layer 20 corresponds to a layer for performing a main function of the organic light emitting device for displaying an image. The component layer 20 may include a thin film transistor and an emitting component.

The barrier layer 30 is formed on the component layer 20, wherein the barrier layer 30 prevents external water or moisture from being permeated into the component layer 20.

The polarizing film 40 is formed on the barrier layer 30, wherein the polarizing film 40 prevents a reflection of external light. That is, when the external light is incident on the upper substrate 60, and is then provided to the inside of the organic light emitting device, the light may be reflected on a plurality of electrodes or lines formed inside the component layer 20, which might cause a viewer's inconvenience for watching a displayed image. According as the polarizing film 40 is applied to the organic light emitting device, it is possible to prevent the reflection of external light. The polarizing film 40 performing this function may be generally formed of a circular polarizing plate.

The touch sensor 50 is formed on the polarizing film 40. The touch sensor 50 may include a first touch sensor 50a for sensing a touch position in the X-axis direction, and a second touch sensor 50b for sensing a touch position in the Y-axis direction. Each of the first touch sensor 50a and the second touch sensor 50b includes a touch electrode provided with a predetermined pattern on a base film.

The upper substrate 60, which is provided in the uppermost surface of the organic light emitting device, protects the organic light emitting device.

The adhesive layer 70 may include a first adhesive layer 70a, a second adhesive layer 70b, a third adhesive layer 70c, and a fourth adhesive layer 70d. First, the polarizing film 40 adheres to the barrier layer 30 by the use of first adhesive layer 70a, the first touch sensor 50a adheres to the polarizing film 40 by the use of second adhesive layer 70b, the second touch sensor 50b adheres to the first touch sensor 50a by the use of third adhesive layer 70c, and the upper substrate 60 adheres to the second touch sensor 50b by the use of fourth adhesive layer 70d. That is, since the polarizing film 40, the first touch sensor 50a, the second touch sensor 50b, and the upper substrate 60 are manufactured in a separate unit, it inevitably requires the adhering process for combining the above separately-manufactured components together by the use of additional adhesive.

However, the related art organic light emitting device has the following disadvantages.

As mentioned above, the related art organic light emitting device includes the plurality of separately-manufactured components, and thus it also needs the plurality of adhesive layers such as the first adhesive layer 70a, the second adhesive layer 70b, the third adhesive layer 70c, and the fourth adhesive layer 70d.

According as the number of adhesive layers is increased, a thickness of the organic light emitting device is also increased so that it is difficult to realize the organic light emitting device with a thin profile. Due to the increased thickness of the organic light emitting device, a radius of curvature is increased in the organic light emitting device, whereby it is difficult to realize the flexible organic light emitting device which is capable of being bent or curved with easiness.

SUMMARY

Accordingly, the embodiments herein are directed to an organic light emitting device and a method of manufacturing the same that substantially obviate one or more problems due to limitations and disadvantages of the related art.

An aspect of the embodiments herein are directed to providing an organic light emitting device which minimizes the number of adhesive layers, and a method of manufacturing the same.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided an organic light emitting device comprising a first component including a first plurality of layers, the first plurality of layers including a thin film transistor layer deposited on a surface of a first substrate, an emitting component layer deposited on the thin film transistor layer, and a passivation layer deposited on the emitting component layer; a second component including a second plurality of layers that are deposited on a surface of a second substrate without using an adhesive; and an adhesion layer between the first component and the second component, the adhesion layer coupling together the first component and the second component.

In another aspect of embodiments herein, there is provided a method of manufacturing an organic light emitting device that may include forming a first component including a first plurality of layers, the first plurality of layers including a thin film transistor layer deposited on a surface of a first substrate, an emitting component layer deposited on the thin film transistor layer, and a passivation layer deposited on the emitting component layer; forming a second component including a second plurality of layers that are deposited on a surface of a second substrate without using an adhesive; and forming an adhesion layer between the first component and the second component, the adhesion layer coupling together the first component and the second component.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the exemplary embodiments of the present invention, examples of which are illustrated in the accompanying drawings. Wherever possible, the same reference numbers will be used throughout the drawings to refer to the same or like parts.

On explanation about the embodiments herein, when it is mentioned that a first element is positioned "on" a second structure, it should be understood that the first and second elements are brought into contact with each other, or a third element is interposed between the first and second elements.

Also, the term of "deposition" denotes that a layer is formed without using an additional adhesive, for example, the layer is formed by a vapor deposition method such as CVD (Chemical Vapor Deposition) or PVD (Physical Vapor Deposition), or by coating a solution.

Hereinafter, the embodiments will be described in detail with reference to the accompanying drawings.

Figure 1:
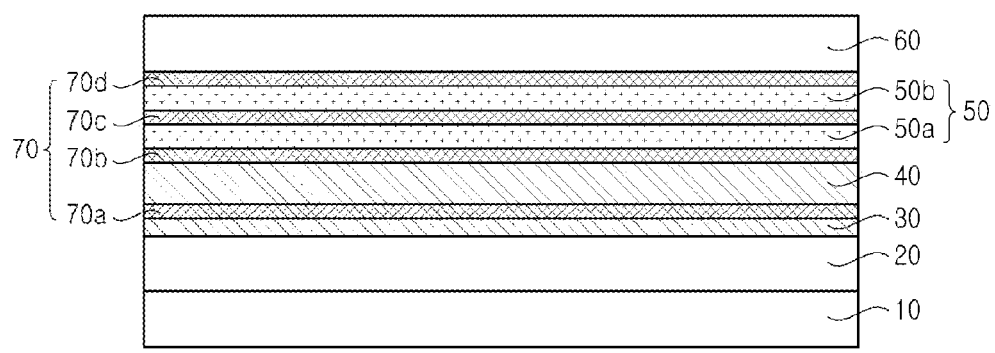
FIG. 1 is a cross sectional view illustrating a related art organic light emitting device.
Figure 2:
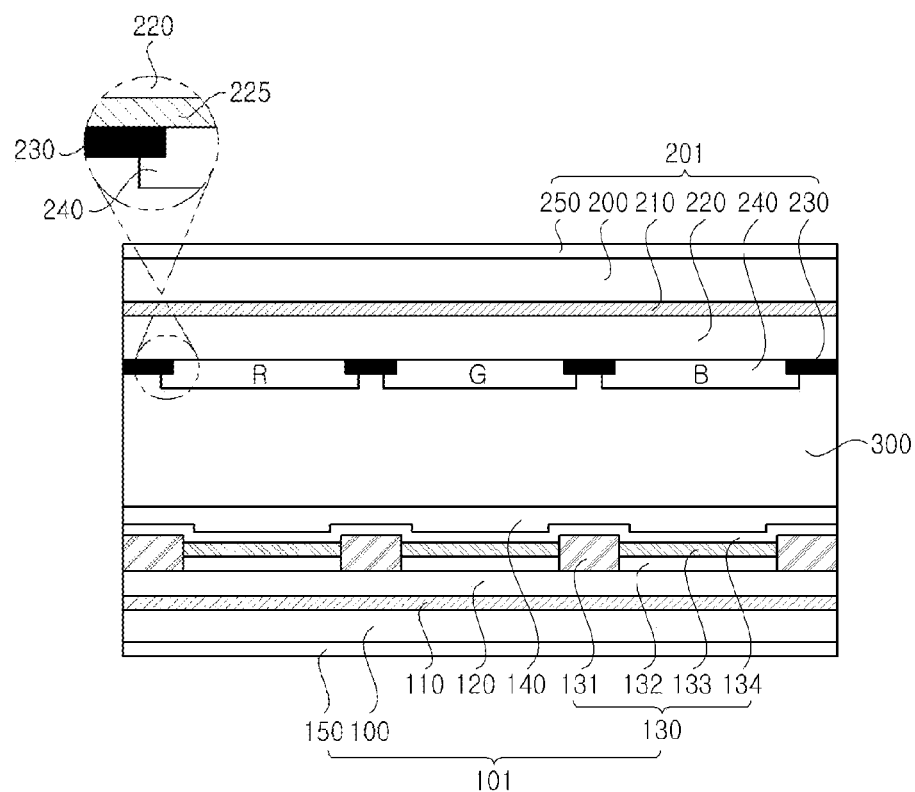
FIG. 2 is a cross sectional view illustrating an organic light emitting device according to one embodiment.

FIG. 2 is a cross sectional view illustrating an organic light emitting device according to one embodiment.

As shown in FIG. 2, the organic light emitting device according to one embodiment may include a lower component 101, an upper component 201, and an adhesive layer 300 provided for adhesion of the lower component 101 and the upper component 201.

The lower component 101 may include a lower substrate 100, a lower barrier layer 110, a thin film transistor layer 120, an emitting component layer 130, a passivation layer 140, and a lower surface reinforcing layer 150.

The lower substrate 100 may be formed of transparent plastic material capable of being bent or curved, for example, polyimide, but it is not limited to this material. For example, the lower substrate 100 may be formed of glass. If the lower substrate 100 is formed of polyimide, it is preferable to use heat-resistant polyimide, which is capable of enduring a high temperature, in consideration of a high-temperature deposition process on the lower substrate 100.

The lower barrier layer 110 is deposited on one surface of the lower substrate 100, and more particularly, on an upper surface of the lower substrate 100 confronting the adhesive layer 300. The lower barrier layer 110 prevents external water or moisture from being permeated into the emitting component layer 130, and also prevents elements included in the lower substrate 100 from spreading toward the thin film transistor layer 120. The lower barrier layer 110 may be formed of silicon oxide or silicon nitride deposited by CVD (Chemical Vapor Deposition).

The thin film transistor layer 120 is deposited on the lower barrier layer 110. The thin film transistor layer 120 may include a plurality of lines such as gate lines, data lines and power lines, and a switching thin film transistor and a driving thin film transistor connected with the plurality of lines. Also, a capacitor may be formed by combination of the lines and electrodes of the thin film transistor. The above lines and thin film transistor constituting the thin film transistor layer 120 may be changed to various types generally known to those in the art.

The emitting component layer 130 is deposited on the thin film transistor layer 120. The emitting component layer 130 may include a bank layer 131, a lower electrode 132, an organic light emitting layer 133, and an upper electrode 134.

The bank layer 131 is deposited on the thin film transistor layer 120, especially, the remaining regions except a pixel region. That is, the pixel region for displaying an image is surrounded by the bank layer 131. The bank layer 131 is formed of an organic insulating material, for example, polyimide, photo acryl, or benzocyclobutene (BCB), but not limited to these materials.

The lower electrode 132 is deposited on the thin film transistor layer 120, especially, the pixel region surround by the bank layer 131. That is, the lower electrode 132 is provided with a plurality of patterns which are respectively positioned in the plurality of pixel regions and are insulated from one another. The lower electrode 132 is electrically connected with the driving thin film transistor provided in the thin film transistor layer 120.

The organic light emitting layer 133 is deposited on the lower electrode 132. The organic light emitting layer 133 may be formed by sequentially depositing a hole injecting layer, a hole transporting layer, an emitting layer, an electron transporting layer, and an electron injecting layer. In this case, it is possible to omit one or more layers among the hole injecting layer, the hole transporting layer, the electron transporting layer and the electron injecting layer except the light emitting layer. The above deposition structure of the plural layers included in the organic light emitting layer 133 may be changed in various ways generally known to those in the art. As the organic light emitting device may include an additional color filter layer to be described, there may be no need to emit color light in each pixel, whereby the organic light emitting layer 133 provided in each pixel may be configured to emit white-color light, but not necessarily. The organic light emitting layer 133 may be configured to separately emit red-color light, green-color light and blue-color light in the respective pixels. The structure and material for the organic light emitting layer 133 may be changed in various ways generally known to those in the art.

The upper electrode 134 is deposited on the organic light emitting layer 133. The upper electrode 134 may function as a common electrode, whereby the upper electrode 134 may be formed on the bank layer 131 as well as the organic light emitting layer 133.

The passivation layer 140 is deposited on the emitting component layer 130, and more particularly, the upper electrode 134, wherein the passivation layer 140 protects the emitting component layer 130.

The lower surface reinforcing layer 150 is formed on the other surface of the lower substrate 100, and more particularly, a lower surface of the lower substrate 100. The lower surface reinforcing layer 150 is provided to improve the mechanical properties of a finally-manufactured product. The lower surface reinforcing layer 150 may be deposited on the other surface of the lower substrate 100 by a coating process, or may be formed in a film type adhered to the other surface of the lower substrate 100. In order to minimize a adhesion process, it is preferable that the lower surface reinforcing layer 150 be deposited on the other surface of the lower substrate 100 by the coating process. For minimizing a thickness of the organic light emitting device, it is possible to omit the lower surface reinforcing layer 150.

As described above, all of the lower barrier layer 110, the thin film transistor layer 120, the emitting component layer 130 and the passivation layer 140 constituting the lower component 101 may be sequentially deposited on one surface of the lower substrate 100 without using an additional adhesive layer. Thus, it is possible to prevent the lower component 101 from being thick, and also to simplify a manufacturing process.

The upper component 201 may include an upper substrate 200, an upper barrier layer 210, a touch sensor 220, a light-shielding layer 230, a color filter layer 240, and a reflection preventing layer 250.

The upper substrate 200 may be formed of transparent plastic material capable of being bent or curved, for example, polyimide, but it is not limited to this material. For example, the upper substrate 200 may be formed of glass.

The upper barrier layer 210 is deposited on one surface of the upper substrate 200, and more particularly, a lower surface of the upper substrate 200 confronting the adhesive layer 300. Like the aforementioned lower barrier layer 110, the upper barrier layer 210 prevents external water or moisture from being permeated into the organic light emitting device, and also prevents elements included in the upper substrate 200 from spreading toward the touch sensor 220. The upper barrier layer 210 may be formed of silicon oxide or silicon nitride.

The touch sensor 220 is deposited on the upper barrier layer 210. In case of the related art, the touch sensor is manufactured by forming a touch electrode with a predetermined pattern on an additional base made of glass or plastic substrate. Thus, the related art touch sensor which is the separately-manufactured component adheres to another component of the organic light emitting device through the use of adhesive. However, in case of the present invention, the touch sensor 220 is manufactured by depositing a touch electrode with a predetermined pattern on the upper barrier layer 210 functioning as a base without using an additional glass or plastic substrate. According to the embodiments herein, there is no need for the additional adhesive to form the touch sensor 220, whereby it is possible to prevent a thickness of organic light emitting device from being increased, and also to simplify a manufacturing process.

The touch sensor 220 comprises the touch electrode deposited on the upper barrier layer 210. In the embodiments herein, a first touch electrode for sensing a touch position in the X-axis direction and a second touch electrode for sensing a touch position in the Y-axis direction may be formed at the same layer.

Figure 3A:
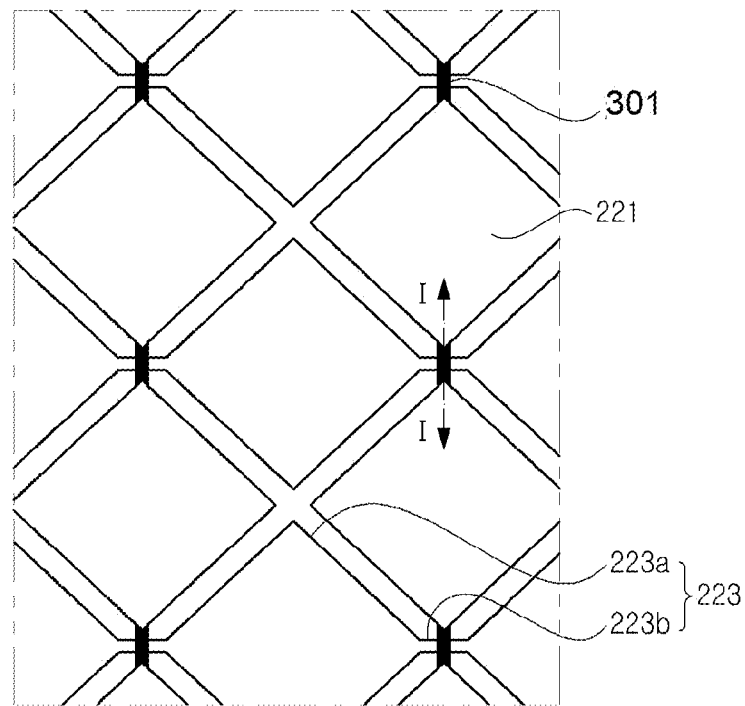
FIG. 3A is a plane view of a touch sensor according to one embodiment.
Figure 3B:
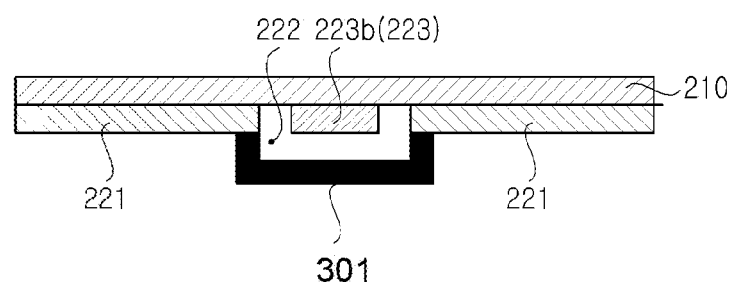
FIG. 3B is a cross sectional view along I-I of FIG. 3A.

FIGS. 3A and 3B illustrate the touch sensor 220 according to one embodiment, wherein the first touch electrode and the second touch electrode are formed at the same layer. FIG. 3A is a plane view of the touch sensor, and FIG. 3B is a cross sectional view along I-I of FIG. 3A.

As shown in FIG. 3A, the touch sensor 220 according to one embodiment may include a first touch electrode 221, a second touch electrode 223, and a bridge electrode 301.

The plurality of first touch electrodes 221 may be provided at fixed intervals in the horizontal and vertical directions. As shown in the drawings, the first touch electrode 221 may be formed in a diamond shape, but it is not limited to this shape. Also, the neighboring two of first touch electrodes 221 provided at the fixed interval in the vertical direction are electrically connected with each other through the bridge electrode 301. According to the connection of the first touch electrode 221 and the bridge electrode 301, it is possible to obtain the electrical connection for the plurality of first touch electrode 221 in the vertical direction. In this case, the bridge electrode 301 prevents a short between the first touch electrode 221 and the second touch electrode 223, and connects the first touch electrodes 221 in the vertical direction. The structure of the bridge electrode 301 will be readily understood with reference to the following cross sectional view of FIG. 3B.

The second touch electrode 223 is formed in an electrode structure extending in the horizontal direction. In more detail, the second touch electrode 223 may include a diamond-shape structure 223a provided between each of the first touch electrodes 221, and a connection structure 223b for connection of the diamond-shape structures 223a, wherein the connection structure 223b is overlapped with the bridge electrode 301. The diamond-shape structure 223a and the connection structure 223b are formed as one body.

The diamond-shape structure 223a may be changed to a shape corresponding to the first touch electrode 221.

Thus, it is possible to obtain the electrode structure extending in the vertical direction according to the connection of the first touch electrode 221 and the bridge electrode 301, and also to obtain the electrode structure extending in the horizontal direction by the second touch electrode 223, thereby sensing a user's touch position in the X-axis direction and the Y-axis direction.

As shown in FIG. 3B, the plurality of first touch electrodes 221 are provided at fixed intervals on the upper barrier layer 210, and the connection structure 223b constituting the second touch electrode 223 is formed between the two of first touch electrodes 221 provided at the fixed interval. That is, the first touch electrode 221 and the second touch electrode 223 are patterned together on the upper barrier layer 210.

On the connection structure 223b constituting the second touch electrode 223, there is an insulating layer 222. Owing to the insulating layer 222, the first touch electrode 221 is insulated from the second touch electrode 223.

The bridge electrode 301 is formed on the insulating layer 222. The bridge electrode 301 is connected with the two of first touch electrodes 221 provided at the fixed interval, whereby the two of first touch electrodes 221 are electrically connected with each other through the bridge electrode 301.

The above touch sensor shown in FIGS. 3A and 3B corresponds to the touch sensor according to one embodiment. However, the touch sensor according is not limited to the above structure shown in FIGS. 3A and 3B. The touch sensor may include various kinds of touch sensors, which are capable of being deposited on the upper barrier layer 210 without using the additional base, generally known to those in the art. For example, the touch sensor may use the touch sensor of infrared scanning type or ultrasound surface acoustic wave type.

Referring once again to FIG. 2, the light-shielding layer 230 is deposited on the touch sensor 220. The light-shielding layer 230 prevents the light from leaking in the remaining regions except the pixel region, wherein the light-shielding layer 230 is overlapped with the aforementioned bank layer 131.

The color filter layer 240 is deposited on the touch sensor 220, and more particularly, the pixel region between each of the light-shielding layers 230. The color filter layer 240 may include red (R), green (G) and blue (B) color filters.

The color filter layer 240 is provided to realize a full-color image on the organic light emitting device. Also, the color filter layer 240, together with the light-shielding layer 230, reduces the reflection of external light, whereby it enables to remove a polarizing film for preventing the reflection of external light, thereby decreasing a thickness of the organic light emitting device. In more detail, when the external light is incident on the organic light emitting device, the external light is absorbed in the light-shielding layer 230, to thereby decrease the reflection of external light. Also, when the external light is provided to the inside of the organic light emitting device, the color filter layer 240 enables to transmit only light with a predetermined wavelength range (for example, red, green or blue light), that is, the color filter layer 240 prevents the light with the remaining wavelength ranges except the predetermined wavelength range from being transmitted therethrough, thereby reducing the reflection of external light. For example, if the light passing through the red color filter layer 240 is reflected on the lower component 101 and is refracted to the green or blue color filter layer 240, the light progress is prevented by the color filter layer 240, to thereby reduce the reflection of external light.

As shown in an expanded part of FIG. 2, a planarization layer 225 may be additionally deposited on the touch sensor 220, and more particularly, between the touch sensor 220 and the light-shielding layer 230, and between the touch sensor 220 and the color filter layer 240. That is, as described above, since the touch sensor 220 is provided with the plurality of touch electrodes with the predetermined pattern, the touch sensor 220 might have a step coverage due to its structure. In this case, it may be difficult to deposit the light-shielding layer 230 and the color filter layer 240 on the touch sensor 220 with the step coverage. Thus, in order to overcome a problem caused by the step coverage, the planarization layer 225 may be additionally provided. However, if needed, it is possible to omit the planarization layer 225.

The reflection preventing layer 250 is formed on the other surface of the upper substrate 200, and more particularly, the upper surface of the upper substrate 200. The reflection preventing layer 250 prevents the reflection of external light. As described above, the reflection of external light provided to the inside of the organic light emitting device is reduced by the light-shielding layer 230 and the color filter layer 240. In addition, the reflection preventing layer 250 may be provided so as to prevent the external light from being reflected on the surface of the organic light emitting device. The reflection preventing layer 250 may be deposited on the other surface of the upper substrate 200 by a coating process for the reflection prevention generally known to those in the art, or may be formed in a film type adhered to the other surface of the upper substrate 200, if needed.

As explained above, the upper barrier layer 210, the touch sensor 220, the light-shielding layer 230, and the color filter layer 240, which constitute the upper component 201, may be sequentially deposited on one surface of the upper substrate 200 without using additional adhesive layers. Accordingly, it is possible to prevent a thickness of the upper component 201 from being increased by the adhesive layer, and also to prevent a manufacturing process from being complicated.

The adhesive layer 300 is formed between the lower component 101 and the upper component 201, and more particularly, between the passivation layer 140 for the lower component 101 and the color filter layer 240 for the upper component 201, wherein the adhesive layer 300 functions as an adhesive between the lower component 101 and the upper component 201.

The adhesive layer 300 may be formed in a film structure such as double-sided tape, or may be formed by coating a liquid adhesive material such as sealant and curing the coated material.

The increased thickness of the adhesive layer 300 causes the increase in thickness of the organic light emitting device, and also might cause light leakage in the region between each of the neighboring pixels. The thickness of the adhesive layer 300 is determined in consideration of a total thickness of the organic light emitting device and a light leakage prevention. Hereinafter, a method of determining the thickness of the adhesive layer 300 in consideration of the light leakage prevention will be described in detail as follows.

Figure 4:
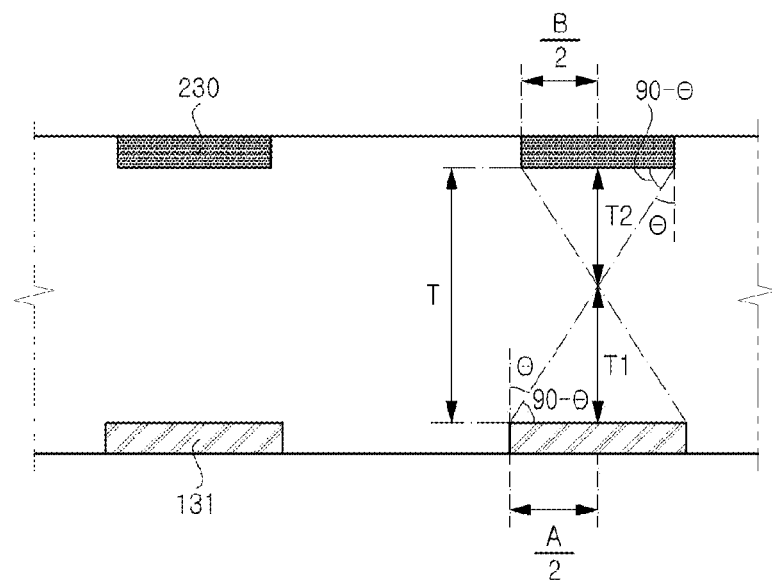
FIG. 4 illustrates a method of determining an adhesive layer to prevent a light leakage between each of neighboring pixels in the organic light emitting device according to one embodiment.

FIG. 4 illustrates a method of determining the thickness of the adhesive layer 300 to prevent the light leakage between each of neighboring pixels in the organic light emitting device according to one embodiment.

As shown in FIG. 4, the bank layer 131 for the lower component (See '101' of FIG. 2) is overlapped with the light-shielding layer 230 for the upper component (See '201' of FIG. 2). In this case, on the assumption that a maximum viewing angle capable of preventing the light leakage between each of the neighboring pixel, that is, preventing the light emitted from one pixel from preceding to the neighboring pixel is 'θ', the following Equations 1 to 3 are established, $$T1 = A \times \tan(90-\theta)/2 \quad \text{Equation 1}$$

$$T2 = B \times \tan(90-\theta)/2 \quad \text{Equation 2}$$

$$T = T1 + T2 = (A+B) \times \tan(90-\theta)/2 \quad \text{Equation 3}$$

wherein, 'A' is a width of the bank layer 131, 'B' is a width of the light-shielding layer 230, and 'T' is a distance between the bank layer 131 and the light-shielding layer 230.

As known from the above Equation 3, the distance 'T' between the bank layer 131 and the light-shielding layer 230 is determined by the width 'A' of the bank layer 131 and the width 'B' of the light-shielding layer 230 when the maximum viewing angle 'θ' is set to a predetermined value. For example, if the maximum viewing angle 'θ' is set to 60°, the distance 'T' between the bank light 131 and the light-shielding layer 230 is about (A+B)/3.464.

Referring to FIG. 2, the color filter layer 240, the adhesive layer 300, the passivation layer 140 and the upper electrode 134 are formed between the bank layer 131 and the light-shielding layer 230. Thus, if the distance 'T' between the bank layer 131 and the light-shielding layer 230 is determined, the thickness of the adhesive layer 300 is determined in consideration of the thickness of the remaining layers except the adhesive layer 300 in the distance 'T' between the bank layer 131 and the light-shielding layer 230. Thus, it is possible to determine the thickness of the adhesive layer 300 so as to prevent the light leakage between each of the neighboring pixels.

Figure 5:
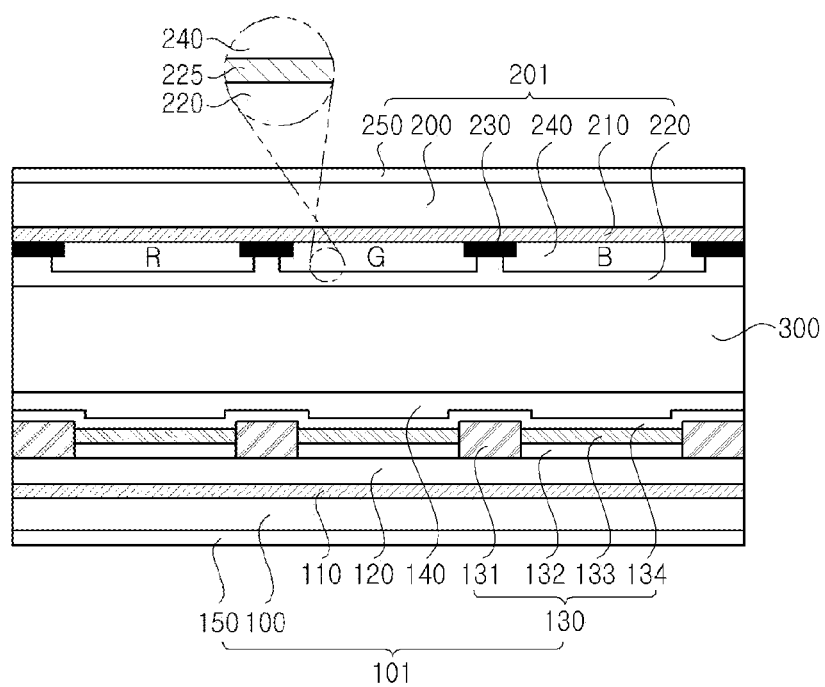
FIG. 5 is a cross sectional view illustrating an organic light emitting device according to another embodiment.

FIG. 5 is a cross sectional view illustrating an organic light emitting device according to another embodiment. Except that a touch sensor 220, a light-shielding layer 230 and a color filter layer 240 included in an upper component 201 are changed in their positions, the organic light emitting device of FIG. 5 is identical in structure to the organic light emitting device of FIG. 2. Thus, the same reference numbers will be used throughout the drawings to refer to the same or like parts, and the detailed explanation for the same parts will be omitted, that is, only the different parts will be described.

As shown in FIG. 5, a light-shielding layer 230 and a color filter layer 240 are deposited on an upper barrier layer 210, and more particularly, a lower surface of the upper barrier layer 210. The light-shielding layer 230 is formed in the remaining regions except the pixel region, and the color filter layer 240 is formed in the pixel region.

Then, a touch sensor 220 is deposited on the color filter layer 240. As shown in an expanded part of FIG. 5, a planarization layer 225 may be additionally deposited on the color filter layer 240, and more particularly, between the color filter layer 240 and the touch sensor 220.

Unlike the aforementioned embodiment of the present invention, an adhesive layer 300 is formed between a passivation layer 140 for a lower component 101 and the touch sensor 220 for an upper component 201.

FIGS. 6A to 6E are cross sectional views illustrating a method of manufacturing the organic light emitting device according to one embodiment, which relate with a method of manufacturing the organic light emitting device of FIG. 2.

Figure 6A:
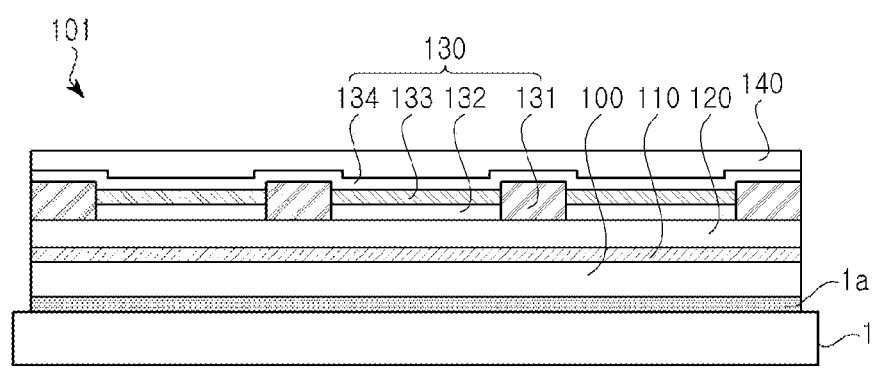
FIGS. 6A to 6E are cross sectional views illustrating a method of manufacturing the organic light emitting device according to one embodiment.

As shown in FIG. 6A, the lower component 101 is formed on a first glass substrate 1.

When the lower substrate 100 for the lower component 101 is formed of transparent plastic capable of being bent or curved, operations such as transfer processes which are repetitively performed for a manufacturing process might be difficult. For this reason, the lower component 101 is formed on the first glass substrate 1 in consideration of convenience for the operations such as the transfer processes, and the first glass substrate 1 is separated from the lower component 101 for the following process.

A first sacrificing layer 1a is deposited on the first glass substrate 1, and the lower component 101 is formed on the first sacrificing layer 1a. The first sacrificing layer 1a enables to fix the lower component 101 to the first glass substrate 1, and enables to easily separate the first glass substrate 1 from the lower component 101 for the following laser separation process. The first sacrificing layer 1a may be formed of hydrogenated amorphous silicon (a-Si:H) by CVD (Chemical Vapor Deposition).

If using the lower substrate 100 of glass substrate, there is no need to additionally provide the first glass substrate 1 and the first sacrificing layer 1a.

The process of forming the lower component 101 will be described in more detail. First, the lower substrate 100 adheres to the first sacrificing layer 1a, the lower barrier layer 110 is deposited on the lower substrate 100, and the thin film transistor layer 120 is deposited on the lower barrier layer 110. Then, the emitting component layer 130 including the bank layer 131, the lower electrode 132, the organic light emitting layer 133, and the upper electrode 134 is deposited on the thin film transistor layer 120. Thereafter, the passivation layer 140 is deposited on the emitting component layer 130.

The above process of forming the lower component 101 may comprise a thin film deposition process such as CVD (Chemical Vapor Deposition), PVD (Physical Vapor Deposition), and a coating method, or comprise a combination of the thin film deposition process and a patterning process such as photolithography.

Figure 6B:
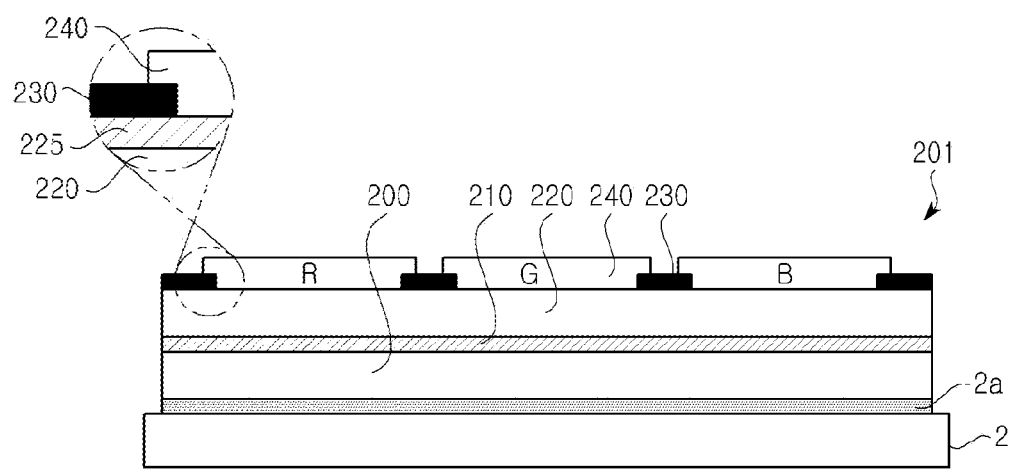

As shown in FIG. 6B, the upper component 201 is formed on a second glass substrate 2.

When the upper substrate 200 for the upper component 201 is formed of transparent plastic capable of being bent or curved, the second glass substrate 2 is applied thereto. Meanwhile, if using the upper substrate 200 of glass substrate, there is no need to additionally provide the second glass substrate 2.

A second sacrificing layer 2a is deposited on the second glass substrate 2, and the upper component 201 is formed on the second sacrificing layer 2a. Like the first sacrificing layer 1a, the second sacrificing layer 2a may be formed of hydrogenated amorphous silicon (a-Si:H) by CVD (Chemical Vapor Deposition).

The process of forming the upper component 201 will be described in more detail. First, the upper substrate 200 adheres to the second sacrificing layer 2a, the upper barrier layer 210 is deposited on the upper substrate 200, the touch sensor 220 is deposited on the upper barrier layer 210, and then the light-shielding layer 230 and the color filter layer 240 are deposited on the touch sensor 220.

Although not shown, the light-shielding layer 230 and the color filter layer 240 are deposited on the upper barrier layer 210, and the touch sensor 220 is deposited on the color filter layer 240, thereby manufacturing the organic light emitting device of FIG. 5.

The above process of forming the upper component 201 may comprise a thin film deposition process such as CVD (Chemical Vapor Deposition), PVD (Physical Vapor Deposition), and a coating method, or comprise a combination of the thin film deposition process and a patterning process such as photolithography.

Figure 6C:
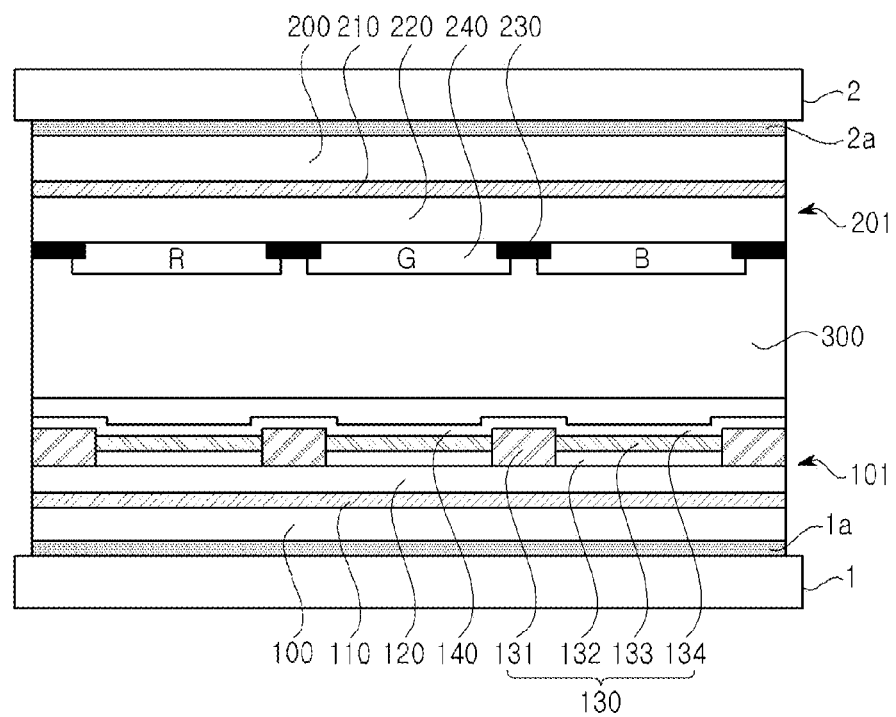

Then, as shown in FIG. 6C, under the condition that the lower component 101 and the upper component 201 confront each other, the lower component 101 and the upper component 201 adhere to each other through the use of adhesive layer 300.

This process may comprise adhering the film structure such as double-sided tape to any one of the lower component 101 and the upper component 201 or coating the liquid adhesive material such as sealant on any one of the lower component 101 and the upper component 201.

Figure 6D:
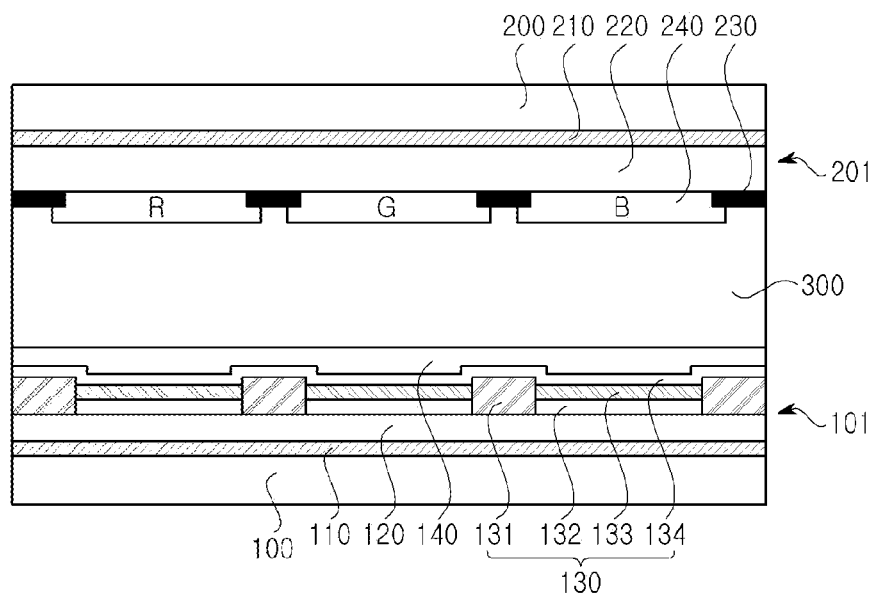

As shown in FIG. 6D, the first glass substrate 1 is separated from the lower component 101, and the second glass substrate 2 is separated from the upper component 201.

The process of separating the first glass substrate 1 and the second glass substrate 2 may be performed by the laser irradiation process. By the laser irradiation, hydrogen gas ($H_2$) is generated from the hydrogenated amorphous silicon (a-Si:H) of the first sacrificing layer 1a and the second sacrificing layer 2a, whereby the first glass substrate 1 is separated from the lower component 101 due to the weak adhesion therebetween and the second glass substrate 2 is separated from the upper component 201 due to the weak adhesion therebetween.

However, the process of separating the first glass substrate 1 and the second glass substrate 2 is not limited to the laser irradiation process. That is, various methods generally known to those in the art may be applied to separate the first glass substrate 1 and the second glass substrate 2.

Figure 6E:
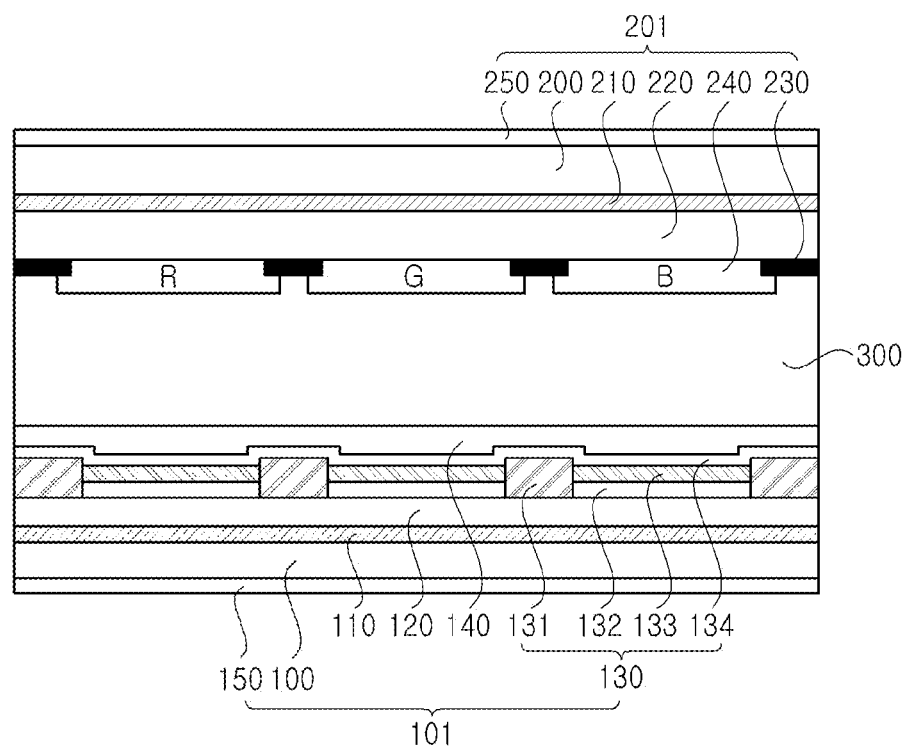

As shown in FIG. 6E, the lower surface reinforcing layer 150 is formed on the lower surface of the lower substrate 100, and the reflection preventing layer 250 is formed on the upper surface of the upper substrate 200, thereby realizing the complete organic light emitting device according to one embodiment of the present invention.

According to the organic light emitting device of the embodiments herein, the thin film transistor layer 120, the emitting component layer 130 and the passivation layer 140 are deposited on one surface of the lower substrate 100 without using the additional adhesive, and the touch sensor 220, the light-shielding layer 230 and the color filter layer 240 are deposited on one surface of the upper substrate 200 without using the additional adhesive so that it is possible to decrease the number of adhesive layers in comparison to the related art. Thus, the organic light emitting device according to the present invention is decreased in its thickness, and also decreased in its radius of curvature, thereby realizing the flexible organic light emitting device.

It will be apparent to those skilled in the art that various modifications and variations can be made to embodiments of the present invention without departing from the spirit or scope of the invention. Thus, it is intended that the present invention covers the modifications and variations of this invention provided they come within the scope of the appended claims and their equivalents.

What is claimed is:

1. A method of manufacturing an organic light emitting device comprising:

forming a first component including a first plurality of layers, the first plurality of layers including a thin film transistor layer deposited on a surface of a first substrate, an emitting component layer deposited on the thin film transistor layer, and a passivation layer deposited on the emitting component layer;

forming a second component including a second plurality of layers, the second plurality of layers deposited on a surface of a second substrate without using an adhesive contacting the surface of the second substrate and at least one of the second plurality of layers, the second plurality of layers including a touch sensor deposited on the second substrate and a color filter layer deposited on the touch sensor or the second plurality of layers including the color filter layer deposited on the second substrate and the touch sensor deposited on the color filter layer; and forming an adhesion layer between the first component and the second component, the adhesion layer coupling together the first component and the second component.

2. The method of claim 1, further comprising:

depositing a first barrier layer between the first substrate and the thin film transistor; and depositing a second barrier layer between the second substrate and the touch sensor.

3. The method of claim 1, wherein forming the first component comprises:

forming a bank layer that overlaps a light-shielding layer included in the color filter layer of the second component.

4. The method of claim 3, wherein the light-shielding layer and the bank layer are formed with a distance (T) between the light-shielding layer and the bank layer, the distance (T) satisfying the following equation:

$$T=(A+B)\times\tan(90-\theta)/2,$$

wherein A is a width of the bank layer, B is a width of the light-shielding layer, and θ is a maximum viewing angle for preventing light leakage between each neighboring pixel of the organic light emitting device.

5. The method of claim 1, wherein forming the second component further comprises:

forming a reflection preventing layer on another surface of the second substrate.

6. The method of claim 1, wherein forming the first component further comprises:

forming a reinforcement layer on another surface of the first substrate.

7. The method of claim 1, wherein forming the second component further comprises:

forming a planarization layer deposited between the color filter layer and the touch sensor.

8. The method of claim 1, wherein another surface on the first substrate is formed on a first sacrificing layer, and the first sacrificing layer is formed on a third substrate, and wherein another surface of the second surface is formed on a second sacrificing layer, and the second sacrificing layer is formed on a fourth substrate.

9. The method of claim 8, further comprising:

separating the third substrate from the first component layer; and separating the fourth substrate from the second component layer.

10. The method of claim 9, wherein separating the third substrate comprises applying a laser to the first sacrificing layer to separate the first sacrificing layer from the first substrate and wherein separating the fourth substrate comprises applying the laser to the second sacrificing layer to separate the second sacrificing layer from the second substrate.

* * * * *